(12) United States Patent
Cheng et al.

(10) Patent No.: US 11,994,740 B2
(45) Date of Patent: May 28, 2024

(54) OPTICAL ELEMENT DRIVE MECHANISM

(71) Applicant: TDK TAIWAN CORP., Taoyuan (TW)

(72) Inventors: Pai-Jui Cheng, Taoyuan (TW);
Shu-Shan Chen, Taoyuan (TW);
Chieh-An Chang, Taoyuan (TW);
Chao-Chang Hu, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 358 days.

(21) Appl. No.: 17/459,358

(22) Filed: Aug. 27, 2021

(65) Prior Publication Data
US 2022/0070351 A1    Mar. 3, 2022

Related U.S. Application Data

(60) Provisional application No. 63/071,550, filed on Aug. 28, 2020.

(51) Int. Cl.
*G02B 7/04* (2021.01)
*G01L 1/16* (2006.01)
(Continued)

(52) U.S. Cl.
CPC ............. *G02B 7/04* (2013.01); *G01L 1/16* (2013.01); *G02B 7/003* (2013.01); *G02B 7/02* (2013.01); *G02B 7/09* (2013.01); *G02B 7/1821* (2013.01); *G02B 13/001* (2013.01); *G02B 26/0816* (2013.01); *G02B 26/0875* (2013.01); *G02B 27/0006* (2013.01); *G02B 27/646* (2013.01); *G03B 5/00* (2013.01); *G03B 5/02* (2013.01); *G03B 17/12* (2013.01);

*G06F 3/016* (2013.01); *H02K 41/0354* (2013.01); *H03K 17/964* (2013.01); *H04N 23/54* (2023.01);
(Continued)

(58) Field of Classification Search
CPC .. G02B 7/04; G02B 7/003; G02B 7/02; G02B 7/09; G02B 13/001; G02B 27/646; G03B 5/00; G03B 3/10; G03B 13/36; H04N 23/685; H04N 23/682
See application file for complete search history.

(56) References Cited

U.S. PATENT DOCUMENTS

| | | | |
|---|---|---|---|
| 2012/0212844 A1* | 8/2012 | Stang | G02B 7/08 29/25.35 |
| 2016/0161828 A1* | 6/2016 | Lee | G02B 7/04 359/824 |

(Continued)

FOREIGN PATENT DOCUMENTS

KR    20070065699 A  *  6/2007  ............... G02B 7/04

OTHER PUBLICATIONS

Machine Translation of KR 20070065699 A (Year: 2007).*

*Primary Examiner* — Darryl J Collins
*Assistant Examiner* — Matthew Y Lee
(74) *Attorney, Agent, or Firm* — Muncy, Geissler, Olds & Lowe, P.C.

(57) ABSTRACT

An optical element drive mechanism is provided. The optical element drive mechanism includes an immovable part, a movable part, and a drive assembly. The movable part is connected to an optical element that includes an optical axis. The movable part is movable relative to the immovable part. The drive assembly drives the movable part to move relative to the immovable part.

19 Claims, 12 Drawing Sheets

(51) Int. Cl.
*G02B 7/00* (2021.01)
*G02B 7/02* (2021.01)
*G02B 7/09* (2021.01)
*G02B 7/182* (2021.01)
*G02B 13/00* (2006.01)
*G02B 26/08* (2006.01)
*G02B 27/00* (2006.01)
*G02B 27/64* (2006.01)
*G03B 5/00* (2021.01)
*G03B 5/02* (2021.01)
*G03B 17/12* (2021.01)
*G06F 3/01* (2006.01)
*H02K 41/035* (2006.01)
*H03K 17/96* (2006.01)
*H04N 23/54* (2023.01)
*H04N 23/55* (2023.01)
*H04N 23/68* (2023.01)
*H10N 30/30* (2023.01)

(52) U.S. Cl.
CPC ........... *H04N 23/55* (2023.01); *H04N 23/685* (2023.01); *H10N 30/302* (2023.02); *G03B 2205/0069* (2013.01); *H02K 41/0356* (2013.01); *H03K 2217/96062* (2013.01)

(56) References Cited

U.S. PATENT DOCUMENTS

2021/0048682 A1\* 2/2021 Umeda .................. G02B 7/026
2023/0188821 A1\* 6/2023 Kim ....................... H04N 23/54
　　　　　　　　　　　　　　　　　　　　　　348/374

\* cited by examiner

OPTICAL ELEMENT DRIVE MECHANISM

CROSS REFERENCE TO RELATED APPLICATIONS

This application claims the benefit of U.S. Provisional Application No. 63/071,550, filed on Aug. 28, 2020, the entirety of which is incorporated by reference herein.

BACKGROUND OF THE INVENTION

Field of the Invention

The present invention relates to a drive mechanism, and in particular, to an optical element drive mechanism.

Description of the Related Art

As technology has developed, many electronic devices (such as tablet computers and smartphones) may be used for capturing images and recording video. The optical element and the optical element drive mechanism in the electronic device allow the user to use the electronic device to capture images and record video. When the electronic device is being used, shock or vibration may occur, and this may cause the images or video to come out blurry. Therefore, the demand for higher quality images and video is increasing.

BRIEF SUMMARY OF THE INVENTION

An optical element drive mechanism is provided. The optical element drive mechanism includes an immovable part, a movable part, and a drive assembly. The movable part is connected to an optical element that includes an optical axis. The movable part is movable relative to the immovable part. The drive assembly drives the movable part to move relative to the immovable part.

In some embodiments, the drive assembly includes a piezoelectric element, a resilient element, and a transmission element. The piezoelectric element includes a piezoelectric material, the piezoelectric element generates a driving force. The resilient element is disposed on the piezoelectric element. The transmission element extends in a first direction, the transmission element transmits the driving force. In some embodiments, the drive assembly further includes a contact element and a compression element. The contact element is in direct contact with the transmission element. The compression element generates a compression force, so that the contact element is in contact with the transmission element. The compression element has a compression-element opening corresponding to the contact element, and the contact element is received in the compression-element opening. The driving force is transmitted to the contact element by the transmission element, and the compression element thereby drives the movable part to move relative to the immovable part in the first direction.

In some embodiments, the movable part includes a holder, the holder includes a holder opening corresponding to the compression element, and the compression element is received in the holder opening. There is a space between the holder opening and the compression element. The contact element includes a metal material. When viewed from the first direction, the holder opening is polygonal. When viewed from the first direction, the compression element is circular. When viewed from the first direction, the transmission element is circular. In some embodiments, the holder and the compression element include different plastic materials, and the Young's modulus of the holder is less than the Young's modulus of the compression element.

In some embodiments, the optical element drive mechanism further includes a buffer assembly for absorbing vibration of the driving assembly. The buffer assembly includes a buffer element in direct contact with the transmission element. The buffer element and the compression element include different materials. The Young's modulus of the holder is greater than the Young's modulus of the buffer element. When viewed from the first direction, the buffer element is located on a corner of the immovable part that is polygonal. In some embodiments, the transmission element bears a first contact force generated by the buffer assembly, the transmission element bears a second contact force generated by the movable part, and the transmission element bears a third contact force generated by the immovable part. The second contact force is greater than the first contact force and the third contact force, and the first contact force is greater than the third contact force. In some embodiments, the drive assembly is connected to the immovable part via an adhesive element, and the adhesive element includes a plastic material. The first contact force is generated by the buffer element, the second contact force is generated by the compression element, and the third contact force is generated by the adhesive element.

In some embodiments, the buffer assembly further includes a first buffer plate, and the first buffer plate includes a buffer opening. When viewed from the first direction, the buffer element is disposed on a periphery of the buffer opening, and the transmission element is surrounded by the buffer element, so that part of the transmission element is disposed in the buffer opening. The first buffer plate has a plate-like structure that is perpendicular to the first direction. In the first direction, the maximum size of the buffer element is greater than the maximum size of the first buffer plate. The first buffer plate and the buffer element include a groove and a structure corresponding to the groove. In some embodiments, the first buffer plate and the buffer element include different materials, the first buffer plate includes a metal material and the buffer element includes a plastic material, a rubber material, and a silicon material. The Young's modulus of the first buffer plate is different from the Young's modulus of the buffer element. In some embodiments, the Young's modulus of the first buffer plate is greater than the Young's modulus of the buffer element.

In some embodiments, the immovable part includes a case, a bottom, and a base plate, the case is connected to the base plate, and the bottom is disposed between the case and the base plate. The case and the base plate include a metal material, and the bottom includes a plastic material. The case includes a top wall and a side wall, the top wall and the side wall respectively have a plate-like structure, and the top wall is not parallel with the side wall. The first buffer plate is parallel with the top wall and the base plate. The first buffer plate is disposed between the top wall and the base plate, and the minimum distance between the first buffer plate and the top wall is less than the minimum distance between the first buffer plate and the base plate. The first buffer plate is not in contact with the top wall. The bottom and the first buffer plate include a mating portion and another mating portion corresponding to the mating portion. The piezoelectric element is located between the bottom and the base plate, and the minimum distance between the piezoelectric element and the bottom is less than the minimum distance between the piezoelectric element and the base plate. The transmission element includes a first end and a second end, the first end is located in the buffer opening, and the second end is located in a receiving space between the bottom and the base plate. When viewed from a direction that is perpendicular to the first direction, the compression element is located between the buffer opening and the receiving space. The transmission element passes through the receiving space. At least part of the adhesive element is disposed in the receiving space. The receiving space has an open structure.

In some embodiments, the optical element drive mechanism further includes a guidance assembly in contact with the movable part and the immovable part to guide the movable part to move relative to the immovable part in the first direction. In some embodiments, the guidance assembly includes a guidance element and a guidance plate. The guidance element is fixedly connected to the guidance plate, and the guidance plate is fixedly connected to the base plate. The guidance element has a rod structure extending in the first direction and passing through the bottom. The guidance plate has a plate-like structure. The guidance element and the guidance plate include a metal material, and the guidance element and the guidance plate include the same material. When viewed from a direction that is perpendicular to the first direction, the guidance plate is between the bottom and the base plate. In some embodiments, the guidance assembly includes a first guidance element and a second guidance element, the first guidance element and the second guidance element extend in the first direction, the first guidance element and the second guidance element are disposed on a diagonal line, and when viewed from the first direction, the diagonal line passes through the optical element. When viewed from the first direction, the area of the first guidance element is equal to the area of the second guidance element. In some embodiments, the first buffer plate further includes a first receiving opening, and part of the first guidance element is disposed in the first receiving opening. The minimum distance between the first receiving opening and the first guidance element is less than the minimum distance between the buffer opening and the transmission element. In some embodiments, the buffer assembly further includes a second buffer plate, the first buffer plate and the second buffer plate are disposed on the diagonal line, part of the first guidance element is disposed at the first buffer plate, and part of the second guidance element is disposed at the second buffer plate. In some embodiments, the first guidance element is closer to the transmission element than the second guidance element.

In some embodiments, the first guidance element bears a fourth contact force generated by the buffer assembly, the first guidance element bears a fifth contact force generated by the movable part, and the first guidance element bears a sixth contact force generated by the immovable part. The second guidance element bears a seventh contact force generated by the buffer assembly, the second guidance element bears an eighth contact force generated by the movable part, and the second guidance element bears a ninth contact force generated by the immovable part. The second contact force is greater than the fifth contact force and the eighth contact force, and the fifth contact force is greater than the eighth contact force.

In some embodiments, the holder further includes a first guidance opening and a second guidance opening, the first guidance opening corresponds to the first guidance element, and the second guidance opening corresponds to the second guidance element. When viewed from the first direction, a minimum distance between the first guidance opening and the first guidance element is less than a minimum distance between the second guidance opening and the second guidance element. When viewed from the first direction, the first guidance opening is circular, and the second guidance opening is bar-like. When viewed from the first direction, the first guidance opening is smaller than the second guidance opening.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following disclosure provides many different embodiments, or examples, for implementing different features of the subject matter provided. Specific examples of components and arrangements are described below to simplify this disclosure. These are, of course, merely examples and are not intended to be limiting. For example, the formation of a first feature "on" and/or "above" a second feature in the description that follows may include embodiments in which the first and second features are formed in direct contact, and may also include embodiments in which additional features may be formed between the first and second features, so that the first and second features may not be in direct contact. The spatially relative terms are intended to encompass different orientations of the device in use or operation in addition to the orientation depicted in figures. The apparatus may be otherwise oriented (rotated 90 degrees or at other orientations) and the spatially relative descriptors used herein may likewise be interpreted accordingly. In addition, in different examples of this disclosure, symbols or alphabets may be used repeatedly.

Ordinal terms such as "first", "second", etc., used in the description and in claims do not by themselves connote any priority, precedence, or order of one element over another, but are used merely as labels to distinguish one element from another element having the same name. Unless the context requires otherwise, throughout the specification and claims that follow, the word "comprise", "have" and variations thereof, such as "comprises", "comprising", "having" are to be construed in an open, inclusive sense, that is, as "including, but not limited to."

Figure 1:
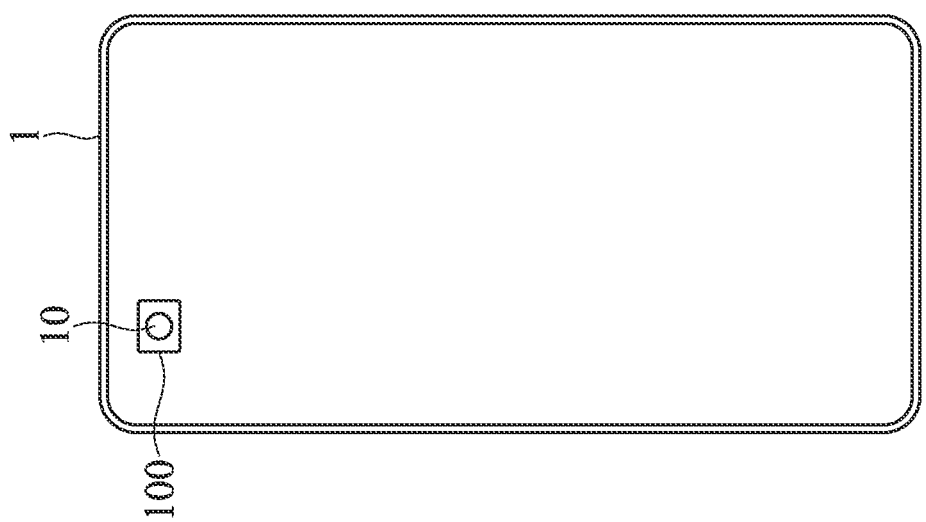
FIG. 1 is a schematic view of the electronic device, the optical element, and the optical element drive mechanism.
Figure 2:
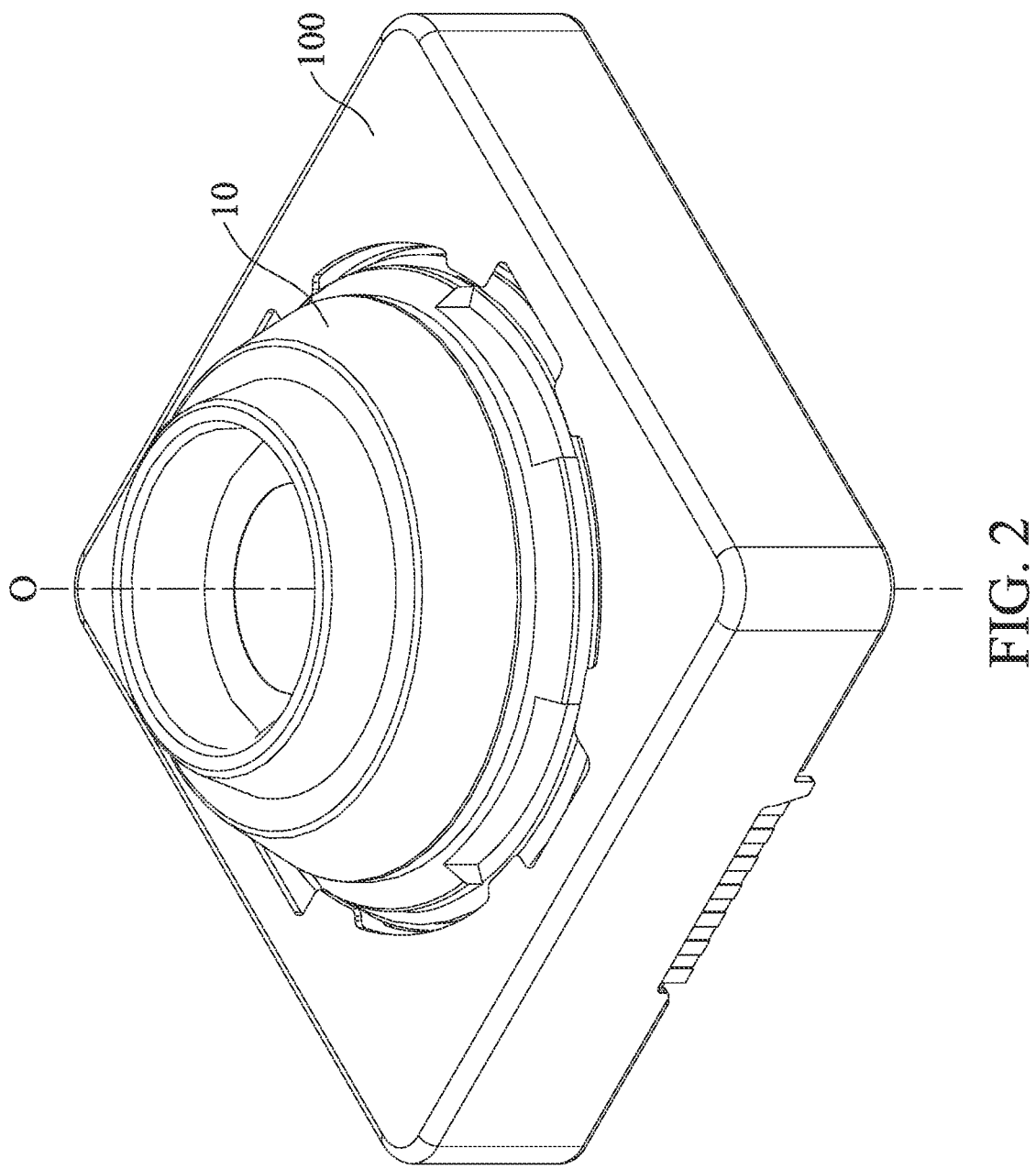
FIG. 2 is a schematic view of the optical element and the optical element drive mechanism.

Please refer to FIG. 1 and FIG. 2. FIG. 1 is a schematic view of an electronic device 1, an optical element 10, and an optical element drive mechanism 100. FIG. 2 is a schematic view of the optical element 10 and the optical element drive mechanism 100. The electronic device 1 may be a tablet computer, a smart phone, etc. The optical element 10 may be a lens. The optical element 10 may be made of plastic or glass. The optical element 10 may be circular or it may have another shape. The optical element 10 and the optical element drive mechanism 100 may be disposed in the electronic device 1, so that a user may capture images and record video. The optical element drive mechanism 100 may hold the optical element 10 and drive the optical element 10 to move, so as to adjust the position of the optical element 10 to capture clear images. The optical element 10 and the optical element drive mechanism 100 are typically placed in the top region of the electronic device 1 to increase the display area of the electronic device 1.

The optical element 10 has an optical axis O. The optical axis O is an imaginary axis passing through the center of the optical element 10. When the optical element 10 and the optical element drive mechanism 100 are aligned, the optical axis O substantially overlaps the central axis of the optical element drive mechanism 100. Therefore, in the followings and in the drawings, the optical axis O of the optical element 10 may be used to illustrate or describe the related features of the optical element drive mechanism 100. It should be noted that, since the optical element 10 is movably placed in the optical element drive mechanism 100, the optical axis O may be not exactly overlap the central axis of the optical element drive mechanism 100 because of the movement, shake, rotation, tilt of the optical element drive mechanism 100.

Figure 3:
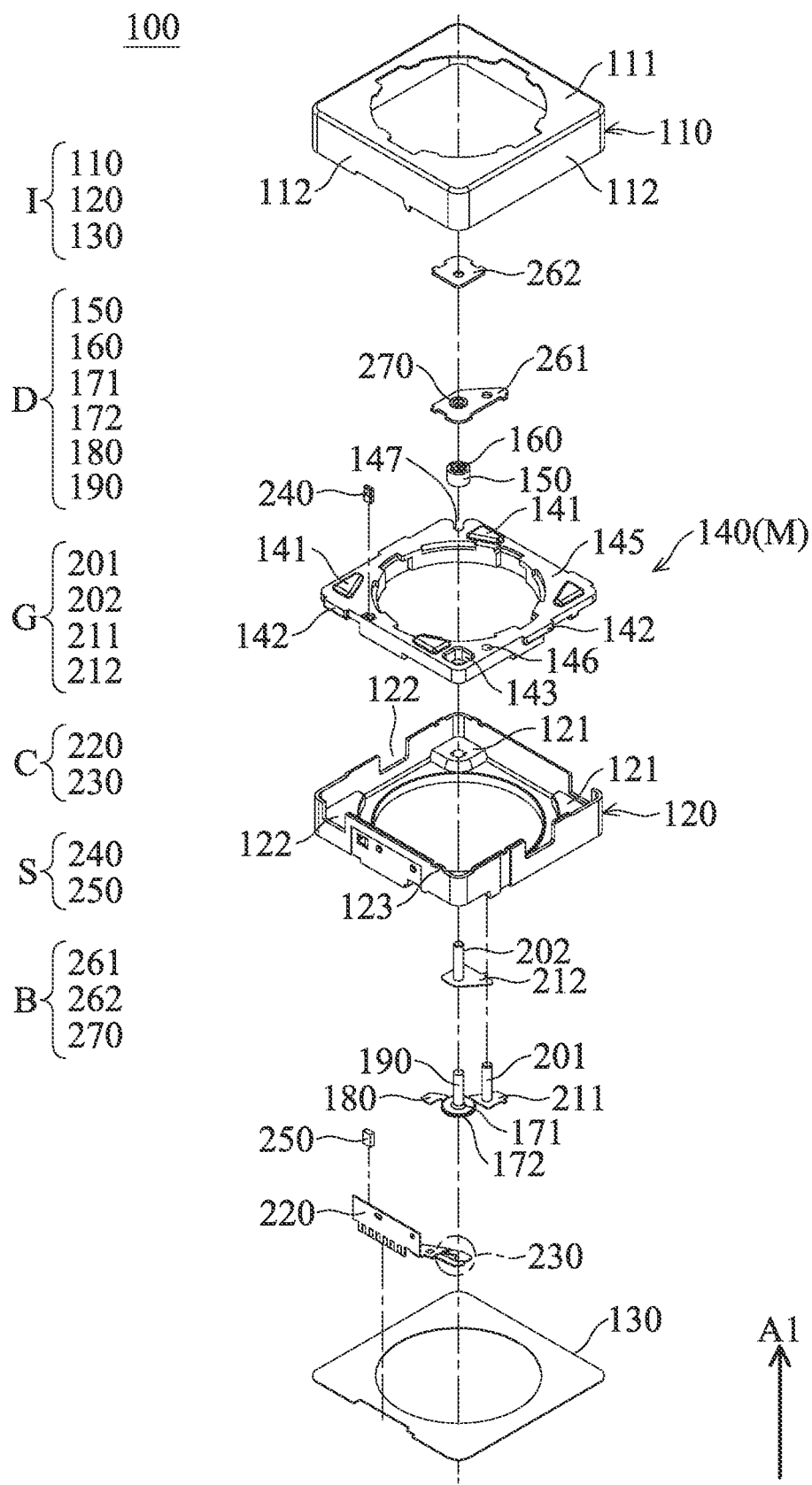
FIG. 3 is an exploded view of the optical element drive mechanism.

Next, please refer to FIG. 3. FIG. 3 is an exploded view of the optical element drive mechanism 100. The optical element drive mechanism 100 includes an immovable part I, a movable part M, a drive assembly D, a guidance assembly G, a circuit assembly C, a sensing assembly S, and a buffer assembly B. The movable part M is connected to the optical element 10. The movable part M is movable relative to the immovable part I. The drive assembly D drives the movable part M to move relative to the immovable part I. The guidance assembly G may guide the movement of the movable part M relative to the immovable part I. The external circuits may be placed on the circuit assembly C, so that the current is supplied to the optical element drive mechanism 100. The sensing assembly S may detect the movement of the movable part M relative to the immovable part I. The description in the present disclosure is merely an example, and the elements may be added to or removed as needed. Also, for clear illustration, some elements may be omitted in the drawings.

In this embodiment, the immovable part I includes a case 110, a bottom 120, and a base plate 130. The case 110 is disposed above the bottom 120 and the base plate 130, and the bottom 120 is disposed between the case 110 and the base plate 130. The case 110 may be connected to the base plate 130. After the case 110 is connected to the base plate 130, the space formed therein may receive and protect the movable part M, the drive assembly D, the guidance assembly G, the sensing assembly S, the buffer assembly B, and the like, to increase the structural strength of the overall optical element drive mechanism 100.

In some embodiments, the case 110 and the base plate 130 include a metal material. In some embodiments, the case 110 may be connected to the base plate 130 by laser welding. In some embodiments, the bottom 120 includes a plastic material, and part of the internal circuits may be formed in the bottom 120 by methods such as insert molding.

The case 110 has a top wall 111 and a plurality of side walls 112. The top wall 111 and the side walls have plate-like structures, and the top wall 111 is not parallel with the side walls 112. In some embodiments, the top wall 111 is substantially perpendicular to the side walls 112. The bottom 120 may include a plurality of bottom stages 121 and a plurality of bottom grooves 122. Each of the bottom grooves 122 may include a groove bottom surface 1221 and a groove side surface 1222 (denoted in FIG. 5). In some embodiments, the bottom 120 may include one or more mating portion 123.

In this embodiment, the movable part M includes a holder 140. The holder 140 is disposed between the case 110 and the bottom 120, and the holder 140 is spaced apart from the case 110 and the bottom 120 by a distance. That is, the holder 140 is not in direct contact with the case 110 and the bottom 120. The holder 140 is hollow to receive the optical element 10. In some embodiments, the holder 140 is made of plastic.

To prevent the holder 140 from being damaged when the movement of the holder 140 reaches the limit, the holder 140 may include one or more stoppers. In this embodiment, the holder 140 includes a plurality of upper stoppers 141 and a plurality of lateral stoppers 142. The upper stoppers 141 protrude from a holder top surface 145 of the holder 140. In particular, the upper stoppers 141 are closer to the case 110 than the holder top surface 145. The lateral stoppers 142 may be received in the bottom grooves 122 of the bottom 120. The upper stoppers 141 and the lateral stoppers 142 may restrict the movement range of the holder 140. For example, when the movement of the holder 140 toward the case 110 reaches the limit, the upper stoppers 141 of the holder 140 may be in contact with the case 110. For example, when the holder 140 vibrates or rotates, the lateral stoppers 142 of the holder 140 may be in contact with the groove side surface 1222 of the bottom groove 122 of the bottom 120.

In some embodiments, the holder 140 may include a holder opening 143, a first guidance opening 146, and a second guidance opening 147. The holder opening 143 and the first guidance opening 146 are located on the same corner of the holder 140. The first guidance opening 146 and the second guidance opening 147 are located on the diagonal line of the holder 140. That is, when viewed from the optical axis O, the first guidance opening 146 and the second guidance opening 147 are located on the diagonal line that passes through the optical element 10. When viewed from the optical axis O, the first guidance opening 146 is circular, and the second guidance opening 147 is bar-like. Therefore, when viewed from the optical axis O, the first guidance opening 146 is smaller than the second guidance opening 147.

Figure 4:
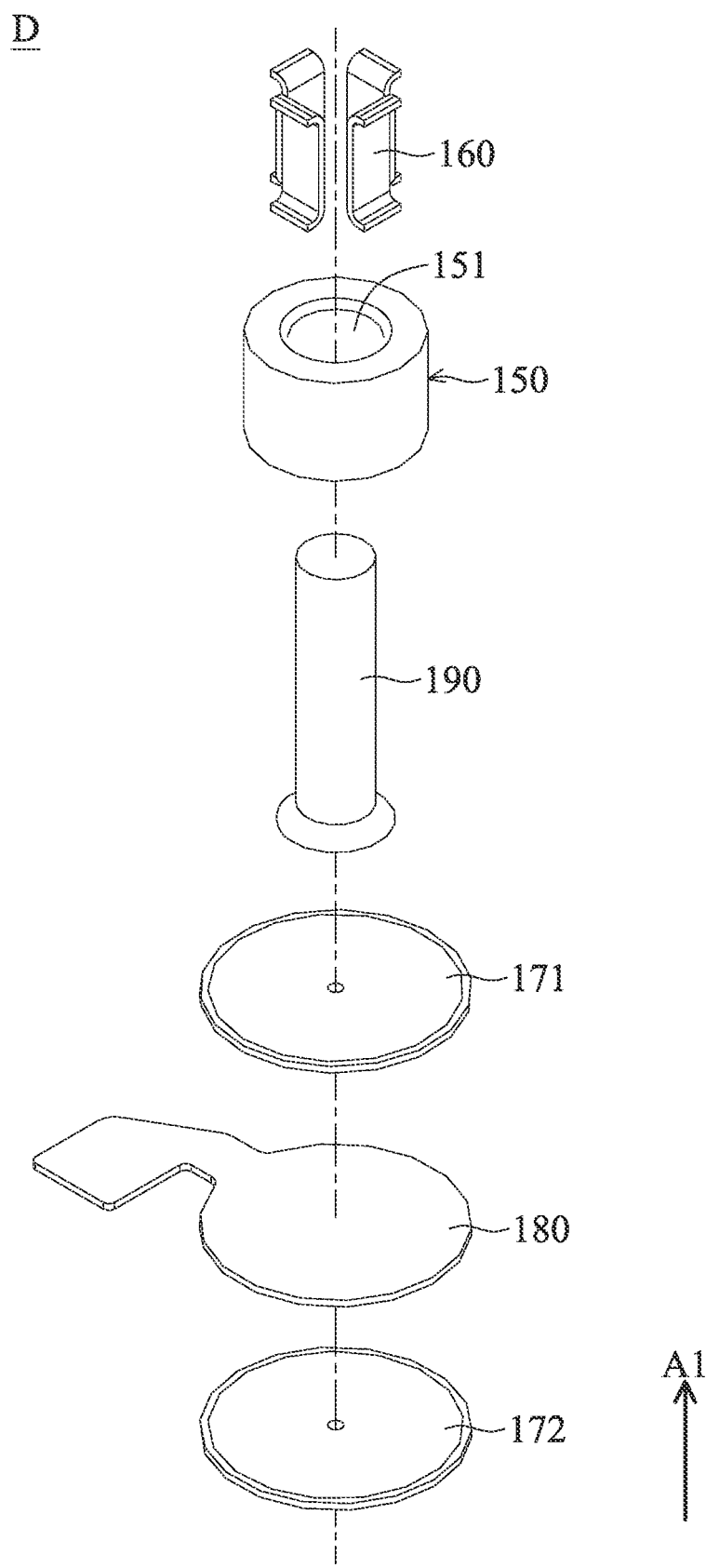
FIG. 4 is an exploded view of the drive assembly.
Figure 5:
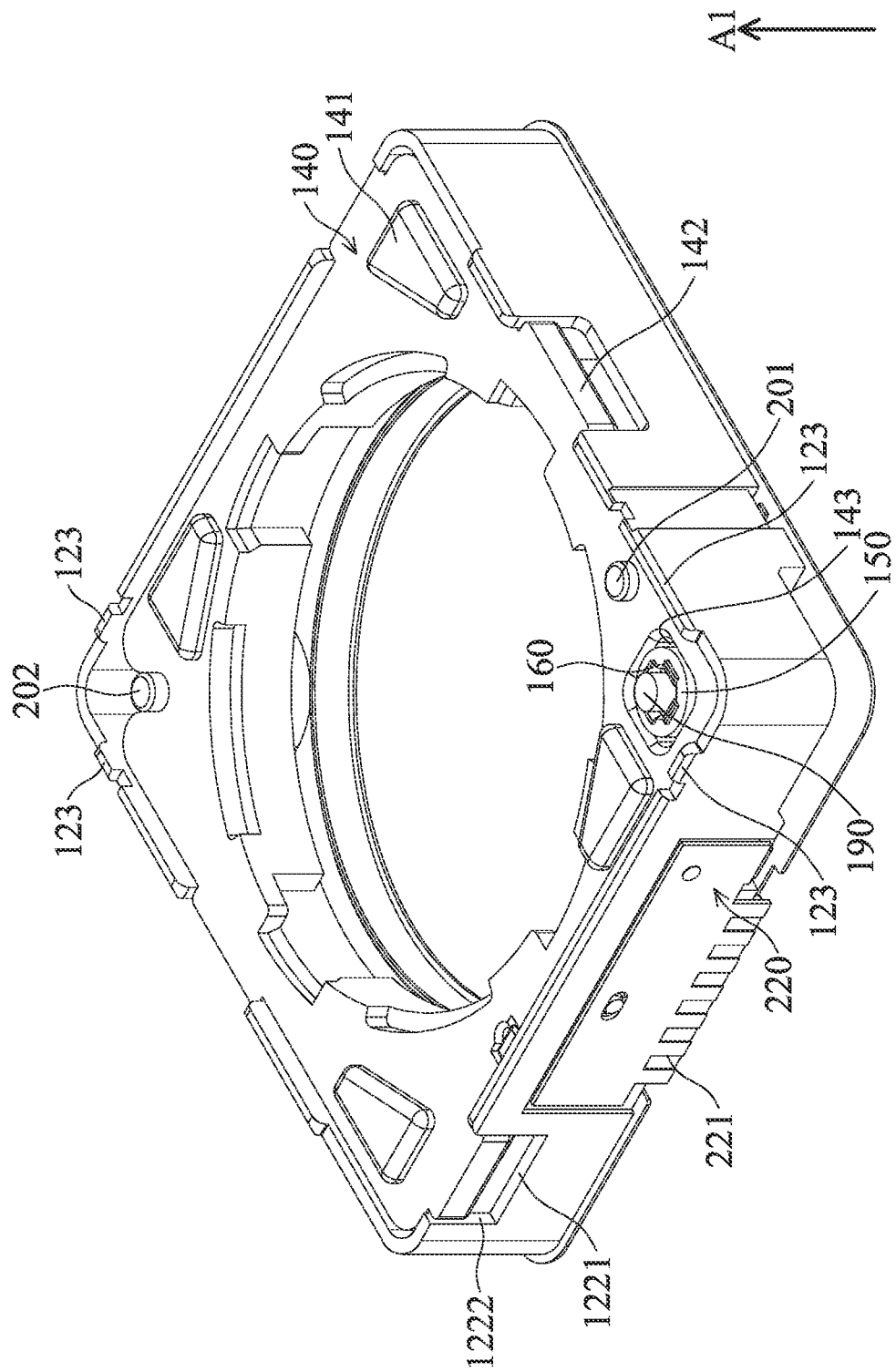
FIG. 5 is a perspective view of the optical element drive mechanism.
Figure 6:
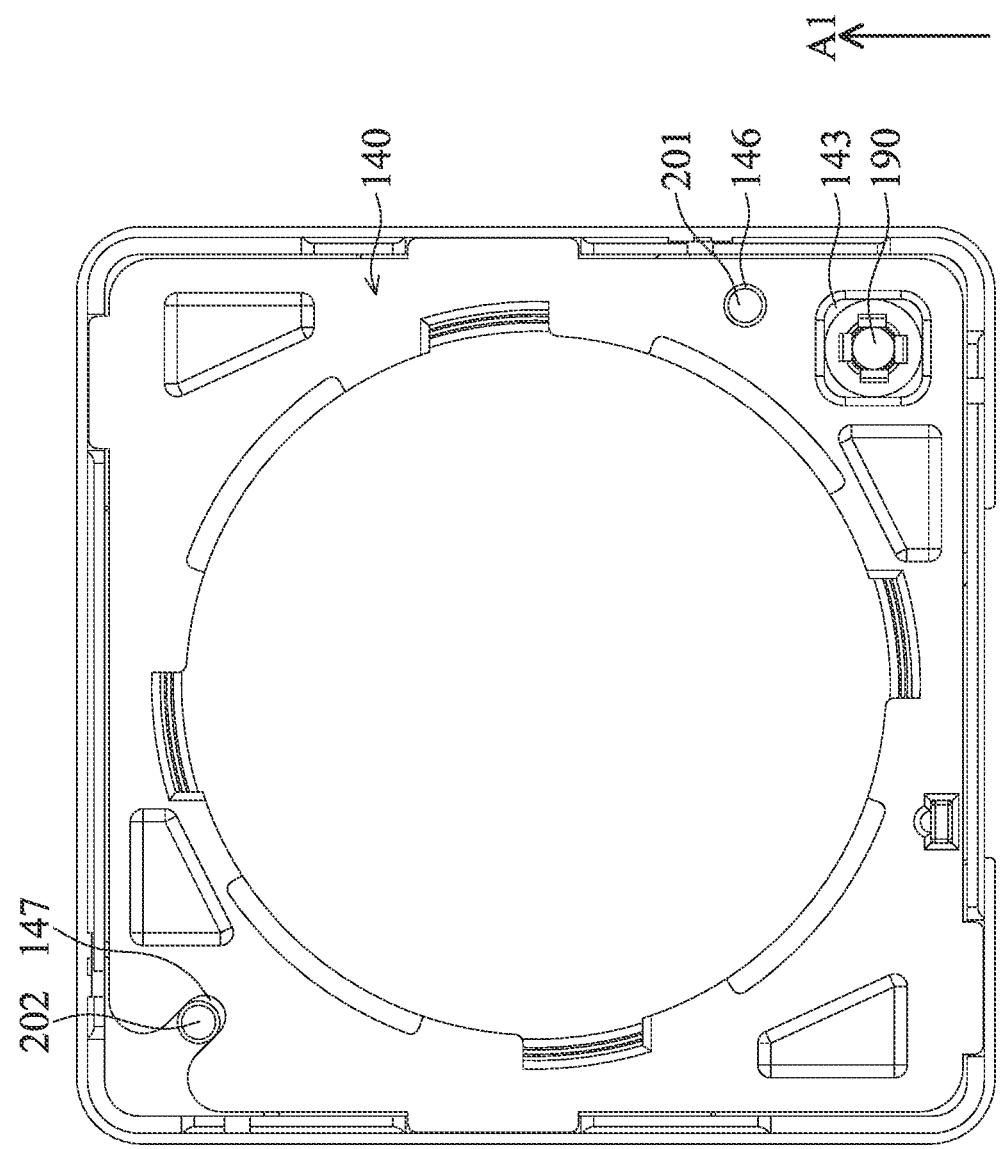
FIG. 6 is a top view of the optical element drive mechanism.
Figure 7:
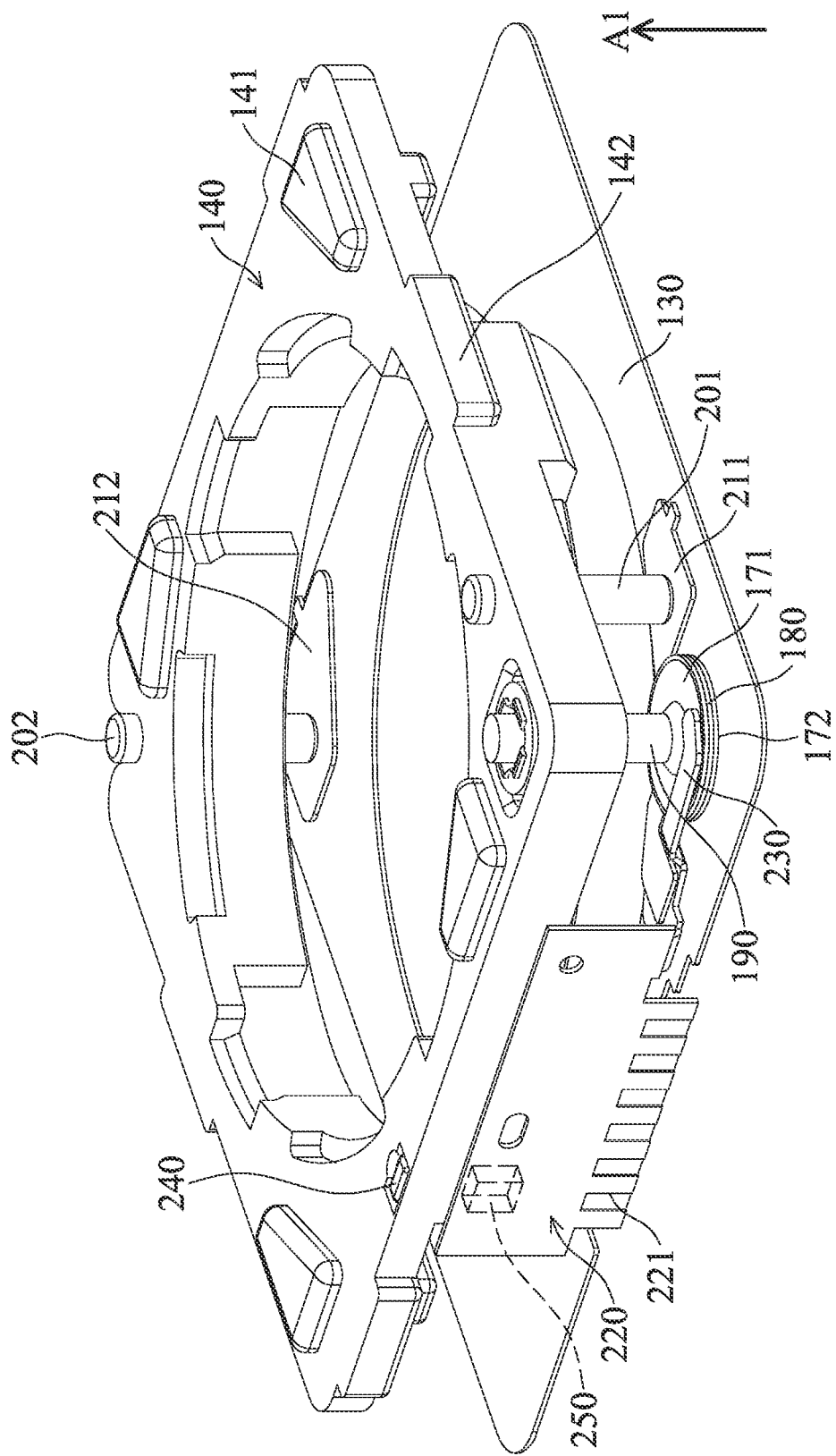
FIG. 7 is a perspective view of the optical element drive mechanism.

Next, in addition to FIG. 3, please also refer to FIG. 4 to FIG. 7 to understand the drive assembly D. FIG. 4 is an exploded view of the drive assembly D. FIG. 5 is a perspective view of the optical element drive mechanism 100. FIG. 6 is a top view of the optical element drive mechanism 100. FIG. 7 is a perspective view of the optical element drive mechanism 100. The drive assembly D is spaced apart from the base plate 120 by a distance. That is, the drive assembly D is not in direct contact with the base plate 120. In this embodiment, the drive assembly D includes a compression element 150, a contact element 160, a first piezoelectric element 171, a second piezoelectric element 172, a resilient element 180, and a transmission element 190.

The compression element 150 is disposed in the holder opening 143. The compression element 150 is fixedly connected to the holder 140 via a first adhesive element (not shown). The first adhesive element may be made of a plastic material. When viewed from the optical axis O, the holder opening 143 is polygonal, and the compression element 150 is circular. Therefore, there is a space formed between the holder opening 143 and the compression element 150, so that the compression element 150 may be successfully disposed in the holder opening 143. In some embodiments, the compression element 150 may be made of an elastic material, such as rubber. In some embodiments, the holder 140 and the compression element 150 include different materials, so the Young's modulus of the holder 140 and the Young's modulus of the compression element 150 are different. In some embodiments, the Young's modulus of the holder 140 is less than the Young's modulus of the compression element 150. If the Young's modulus of one element is different from that of another element, it may represent the elasticities of the elements are different or the hardness of the elements are different.

The compression element 150 includes a compression-element opening 151 corresponding to the contact element 160. The contact element 160 is disposed in the compression-element opening 151 and is in direct contact with the transmission element 190. The contact element 160 may be a single piece or a combination of multiple pieces. In some embodiments, the contact element 160 may be bar-like. In some embodiments, the contact element 160 may be made of metal. The compression element 150 may generate a compression force, so the contact element 160 is in contact with the transmission element 190 in a more stable way.

The first piezoelectric element 171 and the second piezoelectric element 172 are located between the bottom 120 and the base plate 130. The first piezoelectric element 171 and the second piezoelectric element 172 may have substantially the same structures. For example, the first piezoelectric element 171 and the second piezoelectric element 172 may have plate-like structures. The first piezoelectric element 171 and the second piezoelectric element 172 may be made of a piezoelectric material, such as a metal material or a ceramic material. The minimum distance between the first piezoelectric element 171 and the bottom 120 is less than the minimum distance between the first piezoelectric element 171 and the base plate 130. That is, the first piezoelectric 171 is closer to the bottom 120. The first piezoelectric element 171 and the second piezoelectric element 172 may deform to generate a driving force.

The resilient element 180 may have a plate-like structure. The resilient element 180 may be disposed between the first piezoelectric element 171 and the second piezoelectric element 172. The transmission element 190 passes through the holder 140 and the bottom 120. The transmission element 190 is fixedly connected to the bottom 120 via a second adhesive element (not shown). The second adhesive element may include a plastic material. The transmission element 190 may have a bar-like structure, such as a rod-like structure or a stick-like structure. The transmission element 190 may be a carbon rod. The transmission element 190 may extend in a first direction A1. When viewed from the first direction A1, the transmission element 190 may be circular. The transmission element 190 may be used for transmitting the driving force generated by the first piezoelectric element 171 and the second piezoelectric element 172 to the contact element 160. This is how the compression element 150 drives the holder 140 to move relative to the bottom 120 in the first direction A1.

In this embodiment, the first direction A1 is substantially parallel with the optical axis O, so the optical element 10 inside the holder 140 may be driven to move along the optical axis O to achieve auto focus (AF). The quality of the images is enhanced due to AF. However, the extending direction of the transmission element 190 may be changed to change the transmission direction of the driving force. In some other embodiments, the transmission element 190 extends in a direction that is perpendicular to the optical axis O, so the optical element 10 inside the holder 140 may be driven to move along the direction that is perpendicular to the optical axis O to achieve optical image stabilization (OIS). The deviation of the images caused by shake or being impacted and the problem of blurry images are compensated due to OIS.

Since the driving force generated by the first piezoelectric element 171 and the second piezoelectric element 172 is transmitted by the transmission element 190, the movement (including linear motion, rotation, etc.) of the movable part M is more stable, and high stability and high accuracy may be achieved.

Next, in addition to FIG. 3, please also refer to FIG. 5 to FIG. 7 to understand the guidance assembly G. The guidance assembly G is in contact with the movable part M and the immovable part I to guide the movable part M to move relative to the immovable part I in the first direction A1. In this embodiment, the guidance assembly G includes a first guidance element 201, a second guidance element 202, a first guidance plate 211, and a second guidance plate 212.

In this embodiment, when viewed from the first direction A1, the immovable part I is polygonal, the drive assembly D and the first guidance element 201 are disposed on the same corner of the immovable part I, and the drive assembly D and the second guidance element 202 are disposed on two different corners of the immovable part I. In other words, the first guidance element 201 is closer to the transmission element 190 than the second guidance element 202.

The first guidance element 201 and the second guidance element 202 may have substantially the same structure. The first guidance element 201 and the second guidance element 202 may each have a bar-like structure, such as a rod or a stick. The first guidance element 201 and the second guidance element 202 may each extend in the first direction A1 and pass through the holder 140 and the bottom 120. In particular, the first guidance element 201 is disposed in the first guidance opening 146 of the holder 140 that corresponds to the first guidance element 201, and the second guidance element 202 is disposed in the second guidance opening 147 of the holder 140 that corresponds to the second guidance element 202. When viewed from the first direction A1, the area of the first guidance element 201 is the same as the area of the second guidance element 202.

The first guidance element 201 and the second guidance element 202 are disposed on the diagonal line of the optical element drive mechanism 100. That is, when viewed from the first direction A1, the first guidance element 201 and the second guidance element 202 are disposed on the diagonal line passing through the optical element 10. In some other embodiments, there may be only one guidance element and only one guidance plate. In some other embodiments, there may be more guidance elements and more guidance plates, and at least two of the guidance elements are disposed on the diagonal line of the optical element drive mechanism 100.

When viewed from a direction that is perpendicular to the first direction A1, the first guidance plate 211 and the second guidance plate 212 are located between the bottom 120 and the base plate 130. In some embodiments, the first guidance element 201 and the second guidance element 202 are fixedly connected to the bottom 120 via a third adhesive element (not shown). The third adhesive element may include a plastic material. The first guidance plate 211 and the second guidance plate 212 may have plate-like structures that are perpendicular to the first direction A1. In particular, the first guidance plate 211 and the second guidance plate 212 are parallel with the base plate 130.

The first guidance element 201 and the second guidance element 202 are fixedly connected to the first guidance plate 211 and the second guidance plate 212, respectively, and the first guidance plate 211 and the second guidance plate 212 are fixedly connected to the base plate 130. In some embodiments, the first guidance element 201 and the second guidance element 202 may be connected to the first guidance plate 211 and the second guidance plate 212 by soldering. In some embodiments, the first guidance plate 211 and the second guidance plate 212 may be connected to the base plate 130 by laser welding. In some embodiments, the first guidance element 201, the second guidance element 202 the first guidance plate 211, and the second guidance plate 212 have a metal material. In some embodiments, the first guidance element 201, the second guidance element 202 the first guidance plate 211, and the second guidance plate 212 have the same material.

The guidance assembly G ensures that the movable part M only moves in a certain dimension (e.g. the first direction A1), and prevents unwanted shaking, rotating, or tilting of the movable part M.

Next, in addition to FIG. 3, please also refer to FIG. 5 and FIG. 7 to understand the circuit assembly C. In this embodiment, the circuit assembly C includes a circuit-assembly immovable portion 220 and a circuit-assembly movable portion 230. The circuit-assembly immovable portion 220 has a plate-like structure that is parallel with the first direction A1. Furthermore, the circuit-assembly immovable portion 220 includes an external connection portion 221. The current may be supplied to the optical element drive mechanism 100 via the external connection portion 221. In particular, the external connection portion 221 may be connected to a power supply (not shown) outside the optical element drive mechanism 100, and the external connection portion 221 may include several pins. In this embodiment, the external connection portion 221 may pass through the base plate 130, so the overall thickness of the optical element drive mechanism 100 is reduced, and miniaturization is achieved.

The circuit-assembly movable portion 230 is connected to the circuit-assembly immovable portion 220. The circuit-assembly movable portion 230 may move relative to the movable part M and the immovable part I. When viewed from the first direction A1, the circuit-assembly movable portion 230 includes a branch structure. The branches of the branch structure are movably connected to the first piezoelectric element 171 and the second piezoelectric element 172, respectively. The current is supplied to one of the first piezoelectric element 171 and the second piezoelectric element 172, and the current flows out of the other of the first piezoelectric element 171 and the second piezoelectric element 172. In this way, the driving force is generated because of the change of volume, inertia, and friction force of the first piezoelectric element 171 and the second piezoelectric element 172.

Since the branches of the branch structure of the circuit-assembly movable portion 230 are respectively connected to the first piezoelectric element 171 and the second piezoelectric element 172 located on the opposite sides of the resilient element 180, the junction of the branch structure of the circuit-assembly movable portion 230 and the first piezoelectric element 171 and the junction of the branch structure of the circuit-assembly movable portion 230 and the second piezoelectric element 172 are located at different heights. In other words, in the first direction A1, a first junction of the circuit-assembly movable portion 230 and the drive assembly D is spaced apart from a second junction of the circuit-assembly movable portion 230 and the drive assembly D by a distance that is not zero, and the resilient element 180 is located between the first junction and the second junction.

Next, in addition to FIG. 3, please also refer to FIG. 7 to understand the sensing assembly S. In this embodiment, the sensing assembly S includes a reference element 240 and a sensing element 250. The reference element 240 may be a magnetic element. The sensing element 250 may be a Hall sensor, a Giant Magneto Resistance (GMR) sensor, a Tunneling Magneto Resistance (TMR) sensor, etc.

The reference element 240 is disposed at the movable part M. For example, the reference element 240 may be disposed on the holder 140. The sensing element 250 may be disposed at the circuit assembly C and electrically connected to the circuit assembly C. For example, the sensing element 250 may be disposed at the circuit-assembly immovable portion 220. The sensing element 250 may detect the reference element 240 to find out the position of the movable part M. In particular, the sensing element 250 may detect the change of the lines of magnetic field (including but not limited to the density of the lines of magnetic field and the direction of the lines of magnetic field) of the reference element 240 to find out the position of the holder 140.

Figure 8:
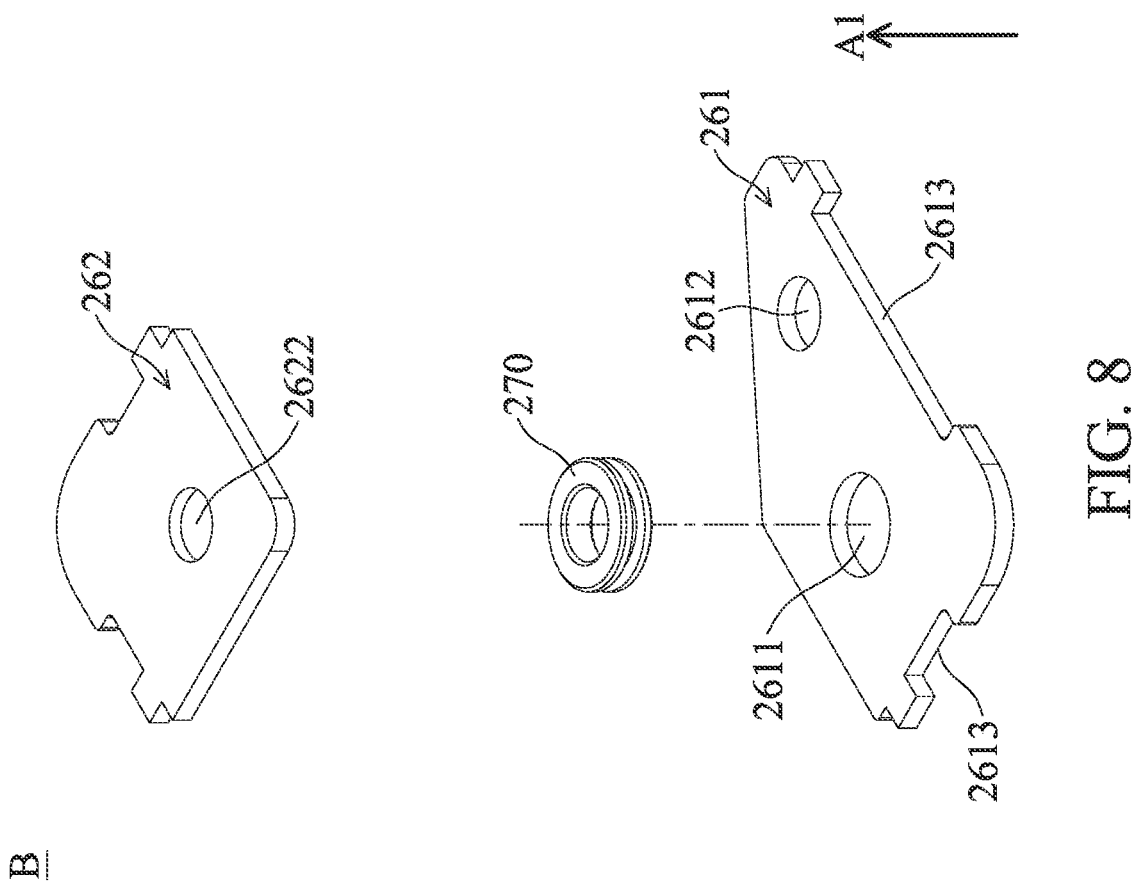
FIG. 8 is an exploded view of the buffer assembly.
Figure 9:
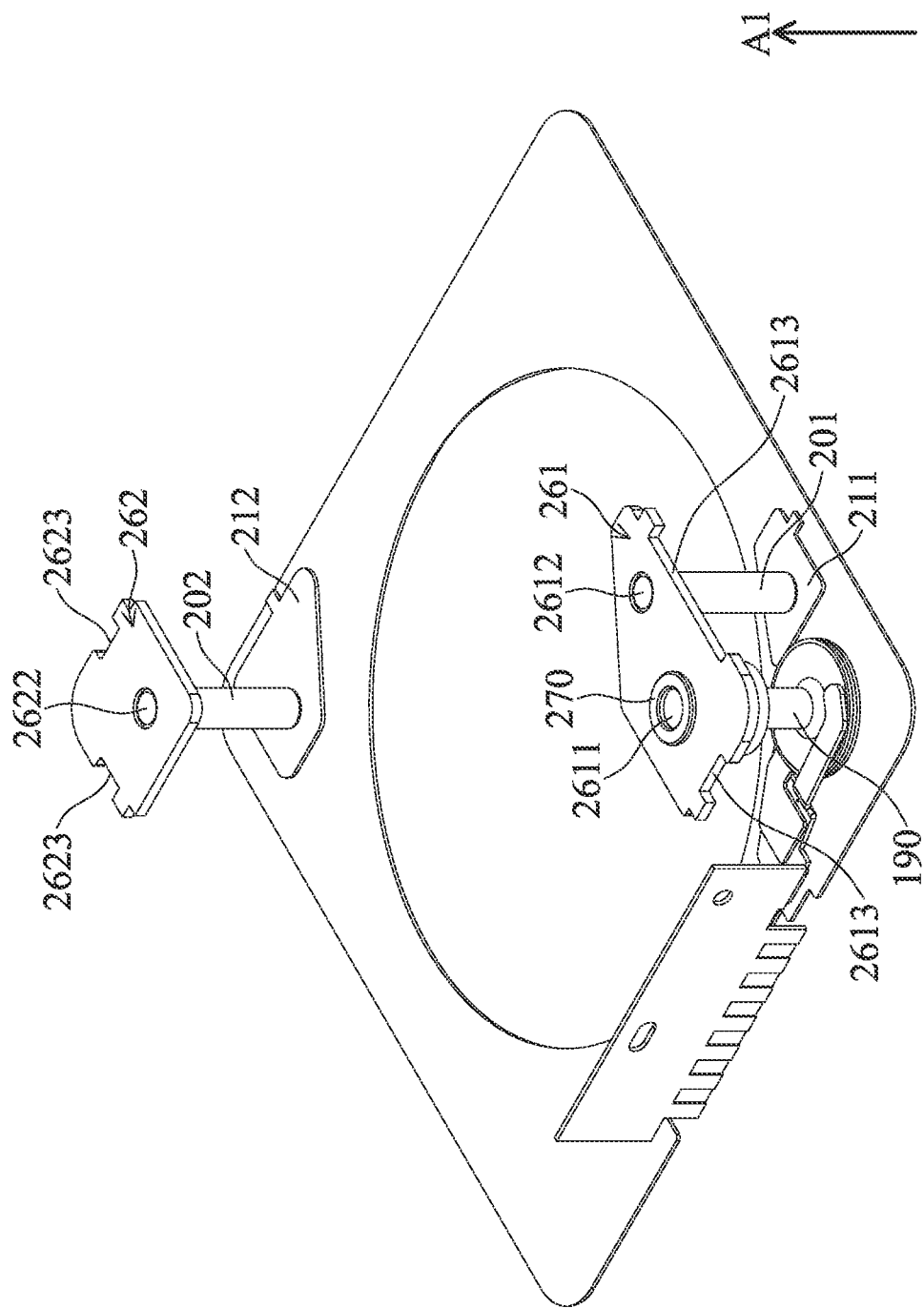
FIG. 9 and FIG. 10 are perspective views of the optical element drive mechanism from different perspectives, wherein the omitted elements are not exactly the same.
Figure 10:
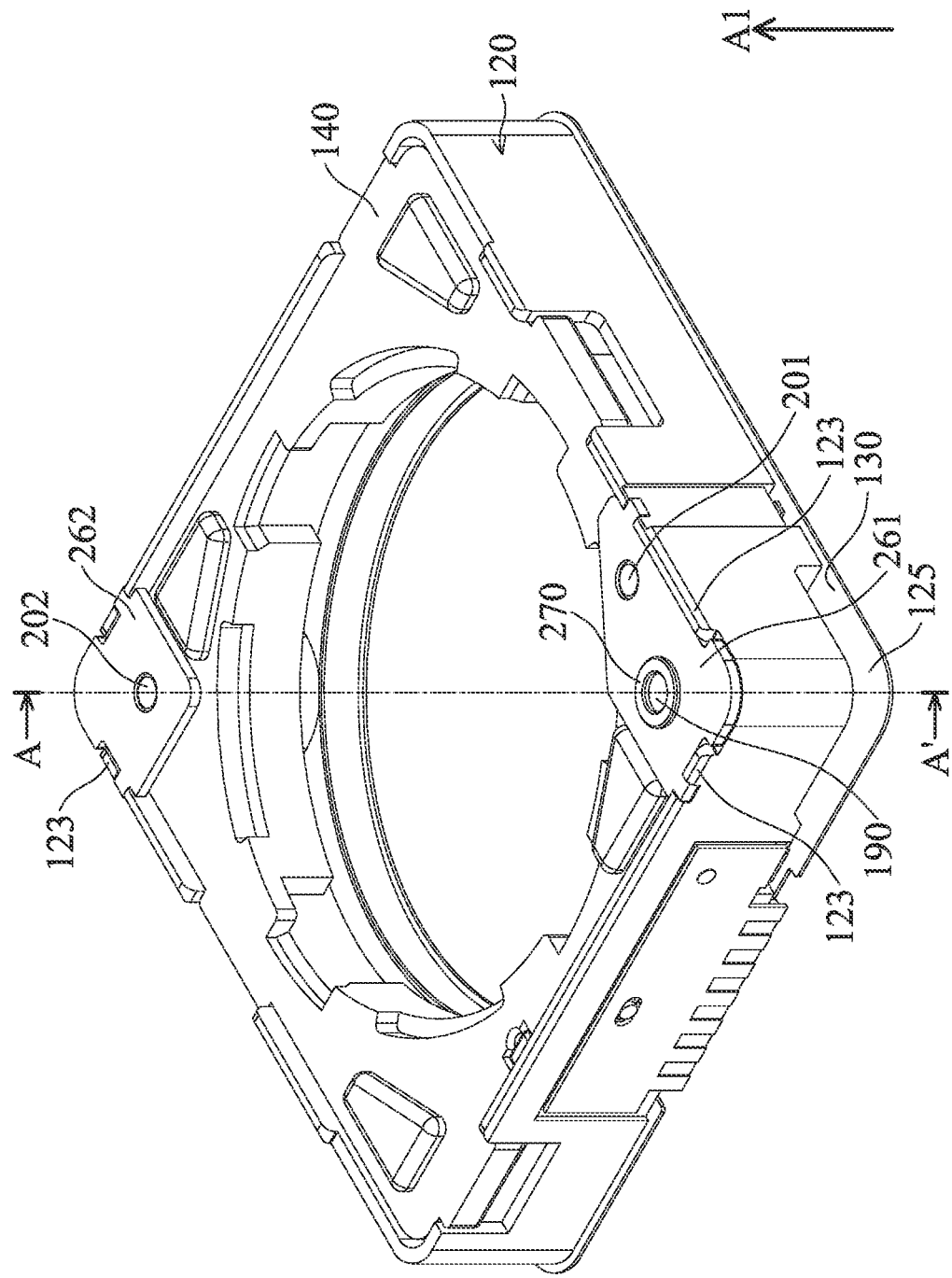

Next, in addition to FIG. 3, please also refer to FIG. 8 to FIG. 10 to understand the buffer assembly B. FIG. 8 is an exploded view of the buffer assembly B. FIG. 9 and FIG. 10 are perspective views of the optical element drive mechanism 100 from different perspectives, wherein the omitted elements are not exactly the same. In this embodiment, the buffer assembly B includes a first buffer plate 261, a second buffer plate 262, and a buffer element 270.

The first buffer plate 261 and the second buffer plate 262 are located between the top wall 1 of the case 110 and the base plate 130. The first buffer plate 261 and the second buffer plate 262 may each have a plate structure that is perpendicular to the first direction A1. In particular, the first buffer plate 261 and the second buffer plate 262 are parallel with the top wall 111 of the case 110 and the base plate 130. The minimum distance between the first buffer plate 261/the second buffer plate 262 and the top wall 111 of the case 110 is less than the minimum distance between the first buffer plate 261/the second buffer plate 262 and the base plate 130. That is, the first buffer plate 261 and the second buffer plate 262 that are located between the top wall 111 of the case 110 and the base plate 130 are closer to the top wall 111 of the case 110. However, the first buffer plate 261 and the second buffer plate 262 are not in direct contact with the top wall 111 of the case 110. The first buffer plate 261 and the second buffer plate 262 are disposed on the diagonal line of the optical element drive mechanism 100.

The first buffer plate 261 includes a buffer opening 2611 and a first receiving opening 2612. The buffer opening 2611 receives the transmission element 190, so that part of the transmission element 190 is disposed in the buffer opening 2611. The first receiving opening 2612 receives the first guidance element 201, so that part of the first guidance element 201 is disposed in the first receiving opening 2612. In some embodiments, the first buffer plate 261 further includes a mating portion 2613 that corresponds to the mating portion 123 of the bottom 120, so that the first buffer plate 261 may be better fixed to the bottom 120.

The second buffer plate 262 includes a second receiving opening 2622. The second receiving opening 2622 receives the second guidance element 202. In some embodiments, the second buffer plate 262 further includes a mating portion 2623 that corresponds to the mating portion 123 of the bottom 120, so that the second buffer plate 262 may be better fixed to the bottom 120. In some embodiments, the first buffer plate 261 and the second buffer plate 262 may include a metal material. In some embodiments, the first buffer plate 261 and the second buffer plate 262 may include the same material.

When viewed from the first direction A1, the buffer element 270 is located on a corner of the immovable part I that is polygonal. In particular, the buffer element 270 is disposed in the buffer opening 2611 of the first buffer plate 261. When viewed from the first direction A1, the buffer element 270 is disposed on the periphery of the buffer opening 2611, and the transmission element 190 is surrounded by the buffer element 270. In some embodiments, the buffer element 270 is in direct contact with the transmission element 190. For example, the buffer element 270 may cover part of the transmission element 190.

At least part of the transmission element 190 passes through a receiving space 125 (denoted in FIG. 10) between the bottom 120 and the base plate 130. The transmission element 190 includes a first end (the top end) and a second end (the bottom end). The first end is located in the buffer opening 2611, and the second end is located in the receiving space 125. The receiving space 125 has an open structure. Also, when viewed from a direction that is perpendicular to the first direction A1, the compression element 150 is also located between the buffer opening 2611 and the receiving space 125. At least part of the second adhesive element between the immovable part I and the transmission element 190 is also disposed in the receiving space 125.

In some embodiments there is a groove and its corresponding structure between the buffer opening 2611 of the first buffer plate 261 and the buffer element 270, so that the buffer element 270 may be better fixed to the first buffer plate 261. In some embodiments, in the first direction A1, the maximum size of the buffer element 270 is greater than the maximum size of the first buffer plate 260. That is, the thickness of the buffer element 270 is greater than the thickness of the first buffer plate 261.

The buffer element 270 may include a plastic material, a rubber material, a silicon material, etc. In some embodiments, the first buffer plate 261 and the buffer element 270 include different materials, so that the Young's modulus of the first buffer plate 261 is different from the Young's modulus of the buffer element 270. In some embodiments, the Young's modulus of the first buffer plate 261 is greater than the Young's modulus of the buffer element 270. Also, in some embodiments, the buffer element 270 and the holder 140 include different materials, so that the Young's modulus of the buffer element 270 is different from the Young's modulus of the holder 140. In some embodiments, the Young's modulus of the holder 140 is greater than the Young's modulus of the buffer element 270.

To reduce the possibility of damage caused by the collision between the case 110 and the transmission element 190 of the drive assembly D and between the case 110 and the first guidance element 201 and the second guidance element 202 of the guidance assembly G, buffering, shake-absorption, and protection may be achieved by the buffer assembly B. In addition, when an element is in contact with another element, particles such as debris and dust may be generated and the images may be affected. Therefore, the buffer assembly B may also reduce the possibility of the generation of particles.

Figure 11:
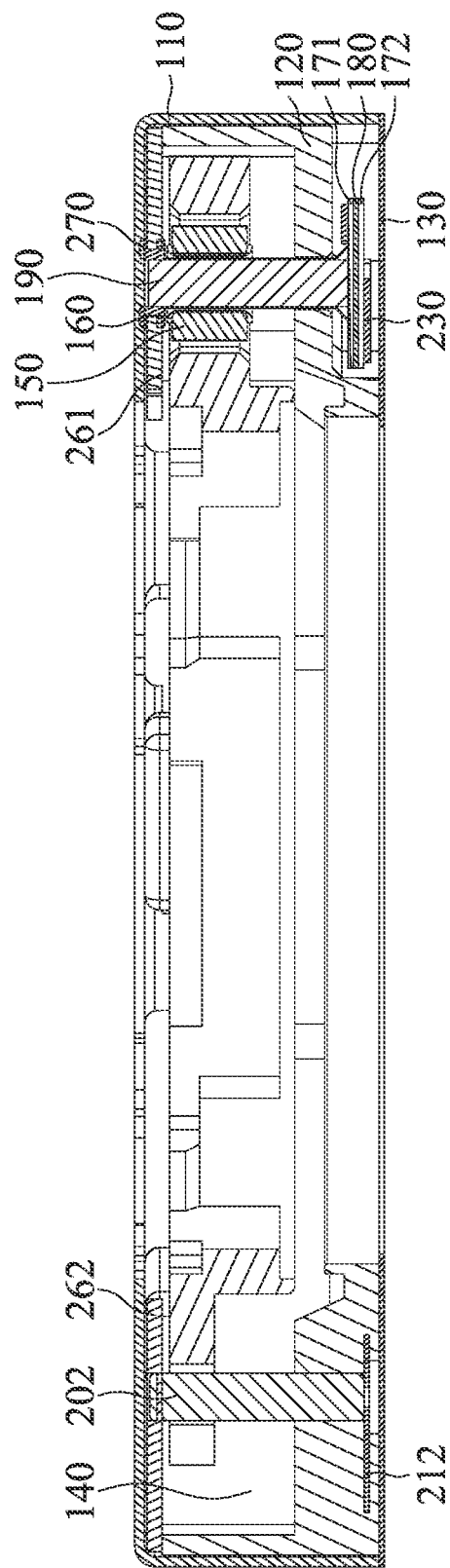
FIG. 11 is a cross-sectional view of the optical element drive mechanism along line A-A' in FIG. 10.
Figure 12:
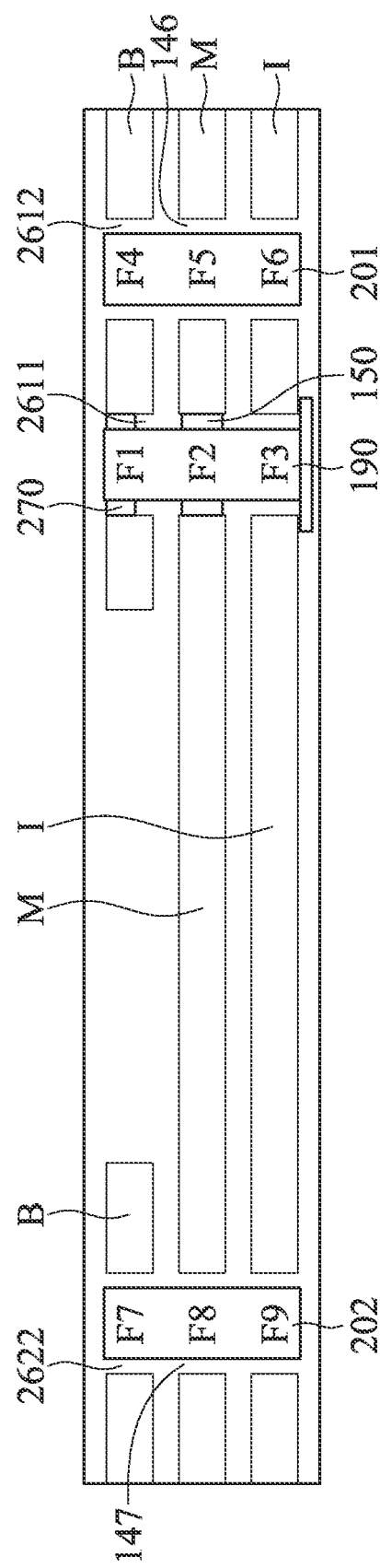
FIG. 12 is a schematic view showing the contact force between the transmission element, the first guidance element, and the second guidance element and the buffer assembly, the movable part, and the immovable part.

Next, please refer to FIG. 11 and FIG. 12. FIG. 11 is a cross-sectional view of the optical element drive mechanism 100 along line A-A' in FIG. 10. FIG. 12 is a schematic view showing the contact force between the transmission element 190, the first guidance element 201, and the second guidance element 202 and the buffer assembly B, the movable part M. and the immovable part I. For simplification, in FIG. 12, the elements and their positional relationship are illustrated in a schematically way. In particular, transmission element 190, the first guidance element 201, and the second guidance element 202 all bear contact force generated by the buffer assembly B, the movable part M. and the immovable part I.

The transmission element 190 bears a contact force generated by the buffer assembly B. and the contact force is defined as a first contact force F1. The transmission element 190 bears a contact force generated by the movable part M, and the contact force is defined as a second contact force F2. The transmission element 190 bears a contact force generated by the immovable part I, and the contact force is defined as a third contact force F3. In particular, the first contact force F1 is applied to the transmission element 190 by the buffer element 270 of the buffer assembly B. The second contact force F2 generated by the holder 140 of the movable part M is applied to the transmission element 190 via the compression element 150. The second contact force F3 is applied to the transmission element 190 by the second adhesive element between the immovable part I and the transmission element 190.

When the driving force is transmitted by the transmission element 190, the second contact force F2 generated by the friction force exerted between the transmission element 190 and the movable part M mainly drives the movable part M to move. The first contact force F1 generated by the buffer assembly B mainly absorbs the vibration of the transmission element 190. The third contact force F3 generated by the immovable part I mainly fix the transmission element 190 in place. Therefore, for the transmission element 190, the second contact force F2 between the transmission element 190 and the movable part M is greater than the first contact force F1 between the transmission element 190 and the buffer assembly B and the third contact force F3 between the transmission element 190 and the immovable part I. Also, the first contact force F1 between the transmission element 190 and the buffer assembly B is greater than the third contact force F3 between the transmission element 190 and the immovable part I.

The first guidance element 201 bears a contact force generated by the buffer assembly B, and the contact force is defined as a fourth contact force F4. The first guidance element 201 bears a contact force generated by the movable part M, and the contact force is defined as a fifth contact force F5. The first guidance element 201 bears a contact force generated by the immovable part I, and the contact force is defined as a six contact force F6.

The second guidance element 202 bears a contact force generated by the buffer assembly B, and the contact force is defined as a seventh contact force F7. The second guidance element 202 bears a contact force generated by the movable part M, and the contact force is defined as an eighth contact force F8. The second guidance element 202 bears a contact force generated by the immovable part I, and the contact force is defined as a ninth contact force F9.

The magnitude of the contact force between the transmission element 190, the first guidance element 201, and the second guidance element 202 and the movable part M may be different. To successfully drive to movable part M, the second contact force F2 generated by the friction force exerted between the transmission element 190 and the movable part M may be greater than the fifth contact force F5 between the first guidance element 201 and the movable part M and the eighth contact force F8 between the second guidance element 202 and the movable part M.

Furthermore, since the first guidance element 201 is closer to the transmission element 190 than the second guidance element 202, the first guidance element 201 may be used as the main guidance element. In some embodiments, when viewed from the first direction A1, the minimum distance between the first guidance opening 146 of the movable part M and the first guidance element 201 is less than the minimum distance between the second guidance opening 147 of the movable part M and the second guidance element 202. That is, the first guidance element 201 and the movable part M may be closer than the second guidance element 202 and the movable part M, so that the fifth contact force F5 between the first guidance element 201 and the movable part M is greater than the eighth contact force F8 between the second guidance element 202 and the movable part M.

It should be noted that, in some embodiments, to further enhance the performance of the first guidance element 201, the minimum distance between the first receiving opening 2612 of the buffer assembly B and the first guidance element 201 is less than the minimum distance between the buffer opening 2611 of the buffer assembly B and the transmission element 190. That is, the first guidance element 201 and the buffer assembly B may be closer than the transmission element 190 and the buffer assembly B, so that the fourth contact force F4 between the first guidance element 201 and the buffer assembly B is greater than the first contact force F1 between the transmission element 190 and the buffer assembly B.

As described above, the drive assembly of the present disclosure transmitting the driving force generated by the piezoelectric element by the transmission element, so that the movement of the movable part (including linear motion, rotation, etc.) is more stable, and high stability and high accuracy may be achieved. Also, the guidance assembly ensures that the movable part only moves in a certain dimension and prevents unwanted shaking, rotating, or tilting of the movable part. Furthermore, due to the buffer assembly, buffering, shake-absorption, and protection may be achieved.

The foregoing outlines features of several embodiments so that those skilled in the art may better understand the aspects of this disclosure. Those skilled in the art should appreciate that they may readily use this disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of this disclosure. In addition, the scope of this disclosure is not limited to the specific embodiments described in the specification, and each claim constitutes a separate embodiment, and the combination of various claims and embodiments are within the scope of the disclosure.

What is claimed is:

1. An optical element drive mechanism, comprising:
    an immovable part;
    a movable part connected to an optical element that has an optical axis, wherein the movable part is movable relative to the immovable part;
    a drive assembly driving the movable part to move relative to the immovable part; and
    a buffer assembly for absorbing vibration of the driving assembly;
    wherein the drive assembly comprises:
    a piezoelectric element comprising a piezoelectric material, wherein the piezoelectric element generates a driving force;
    a resilient element disposed on the piezoelectric element;
    a transmission element extending in a first direction, wherein the transmission element transmits the driving force;
    a contact element in direct contact with the transmission element; and
    a compression element for generating a compression force, so that the contact element is in contact with the transmission element, wherein the compression element has a compression-element opening corresponding to the contact element, and the contact element is received in the compression-element opening;
    wherein the movable part comprises a holder, the holder comprises a holder opening corresponding to the compression element, and the compression element is received in the holder opening,
    wherein there is a space between the holder opening and the compression element;
    wherein the buffer assembly comprises a buffer element in direct contact with the transmission element;
    wherein Young's modulus of the holder is greater than Young's modulus of the buffer element.

2. The optical element drive mechanism as claimed in claim 1,
    wherein the driving force is transmitted to the contact element by the transmission element, and the compression element thereby drives the movable part to move relative to the immovable part in the first direction.

3. The optical element drive mechanism as claimed in claim 1,
    wherein the contact element comprises a metal material;
    wherein when viewed from the first direction, the holder opening is polygonal;
    wherein when viewed from the first direction, the compression element is circular;
    wherein when viewed from the first direction, the transmission element is circular.

4. The optical element drive mechanism as claimed in claim 1, wherein the holder and the compression element comprise different plastic materials, and the Young's modulus of the holder is different from Young's modulus of the compression element.

5. The optical element drive mechanism as claimed in claim 1, wherein the buffer element and the compression element comprise different materials, and when viewed from the first direction, the buffer element is located on a corner of the immovable part that is polygonal.

6. The optical element drive mechanism as claimed in claim 5, wherein the transmission element bears a first contact force generated by the buffer assembly, the transmission element bears a second contact force generated by the movable part, and the transmission element bears a third contact force generated by the immovable part, wherein the second contact force is greater than the first contact force and the third contact force, and the first contact force is greater than the third contact force.

7. The optical element drive mechanism as claimed in claim 6, wherein the drive assembly is connected to the immovable part via an adhesive element, and the adhesive element includes a plastic material, wherein the first contact force is generated by the buffer element, the second contact force is generated by the compression element, and the third contact force is generated by the adhesive element.

8. The optical element drive mechanism as claimed in claim 5, wherein the buffer assembly further comprises a first buffer plate, and the first buffer plate comprises a buffer opening, wherein when viewed from the first direction, the buffer element is disposed on a periphery of the buffer opening, and the transmission element is surrounded by the buffer element, so that part of the transmission element is disposed in the buffer opening;
wherein the first buffer plate has a plate-like structure that is perpendicular to the first direction;
wherein in the first direction, a maximum size of the buffer element is greater than a maximum size of the first buffer plate;
wherein the first buffer plate and the buffer element comprise a groove and a structure corresponding to the groove.

9. The optical element drive mechanism as claimed in claim 8, wherein the first buffer plate and the buffer element comprise different materials, the first buffer plate comprises a metal material and the buffer element comprises a plastic material, a rubber material, and a silicon material, wherein Young's modulus of the first buffer plate is different from the Young's modulus of the buffer element.

10. The optical element drive mechanism as claimed in claim 9, wherein the Young's modulus of the first buffer plate is greater than the Young's modulus of the buffer element.

11. The optical element drive mechanism as claimed in claim 8, wherein the immovable part comprises a case, a bottom, and a base plate, the case is connected to the base plate, and the bottom is disposed between the case and the base plate, wherein the case and the base plate comprise a metal material, and the bottom comprises a plastic material, wherein the case comprises a top wall and a side wall, the top wall and the side wall respectively have a plate-like structure, and the top wall is not parallel with the side wall, wherein the first buffer plate is parallel with the top wall and the base plate, wherein the first buffer plate is disposed between the top wall and the base plate, and a minimum distance between the first buffer plate and the top wall is less than a minimum distance between the first buffer plate and the base plate, wherein the first buffer plate is not in contact with the top wall, wherein the bottom and the first buffer plate comprise a mating portion and another mating portion corresponding to the mating portion, wherein the piezoelectric element is located between the bottom and the base plate, and a minimum distance between the piezoelectric element and the bottom is less than a minimum distance between the piezoelectric element and the base plate, wherein the transmission element comprises a first end and a second end, the first end is located in the buffer opening, and the second end is located in a receiving space between the bottom and the base plate, wherein when viewed from a direction that is perpendicular to the first direction, the compression element is located between the buffer opening and the receiving space, wherein the transmission element passes through the receiving space, wherein the drive assembly is connected to the immovable part via an adhesive element, and at least part of the adhesive element is disposed in the receiving space, wherein the receiving space has an open structure.

12. The optical element drive mechanism as claimed in claim 11, further comprising a guidance assembly in contact with the movable part and the immovable part to guide the movable part to move relative to the immovable part in the first direction.

13. The optical element drive mechanism as claimed in claim 12, wherein the guidance assembly comprises a guidance element and a guidance plate, wherein the guidance element is fixedly connected to the guidance plate, and the guidance plate is fixedly connected to the base plate, wherein the guidance element has a rod structure extending in the first direction and passing through the bottom;
wherein the guidance plate has a plate-like structure;
wherein the guidance element and the guidance plate comprise a metal material, and the guidance element and the guidance plate comprise the same material;
wherein when viewed from a direction that is perpendicular to the first direction, the guidance plate is between the bottom and the base plate.

14. The optical element drive mechanism as claimed in claim 12, wherein the guidance assembly comprises a first guidance element and a second guidance element, the first guidance element and the second guidance element extend in the first direction, the first guidance element and the second guidance element are disposed on a diagonal line, and when viewed from the first direction, the diagonal line passes through the optical element, wherein when viewed from the first direction, area of the first guidance element is equal to area of the second guidance element.

15. The optical element drive mechanism as claimed in claim 14, wherein the first buffer plate further comprises a first receiving opening, and part of the first guidance element is disposed in the first receiving opening, wherein a minimum distance between the first receiving opening and the first guidance element is less than a minimum distance between the buffer opening and the transmission element.

16. The optical element drive mechanism as claimed in claim 14, wherein the buffer assembly further comprises a second buffer plate, the first buffer plate and the second buffer plate are disposed on the diagonal line, part of the first guidance element is disposed at the first buffer plate, and part of the second guidance element is disposed at the second buffer plate.

17. The optical element drive mechanism as claimed in claim 16, wherein the first guidance element is closer to the transmission element than the second guidance element.

18. The optical element drive mechanism as claimed in claim 14, wherein the transmission element bears a first contact force generated by the buffer assembly, the transmission element bears a second contact force generated by the movable part, and the transmission element bears a third contact force generated by the immovable part, wherein the first guidance element bears a fourth contact force generated by the buffer assembly, the first guidance element bears a fifth contact force generated by the movable part, and the first guidance element bears a sixth contact force generated by the immovable part, wherein the second guidance element bears a seventh contact force generated by the buffer assembly, the second guidance element bears an eighth contact force generated by the movable part, and the second guidance element bears a ninth contact force generated by the immovable part, wherein the second contact force is greater than the fifth contact force and the eighth contact force, and the fifth contact force is greater than the eighth contact force.

19. The optical element drive mechanism as claimed in claim 14, wherein the holder further comprises a first guidance opening and a second guidance opening, the first guidance opening corresponds to the first guidance element, and the second guidance opening corresponds to the second guidance element;
- wherein when viewed from the first direction, a minimum distance between the first guidance opening and the first guidance element is less than a minimum distance between the second guidance opening and the second guidance element;
- wherein when viewed from the first direction, the first guidance opening is circular, and the second guidance opening is bar-like;
- wherein when viewed from the first direction, the first guidance opening is smaller than the second guidance opening.

* * * * *